(12) United States Patent
Kim et al.

(10) Patent No.: US 8,852,971 B2
(45) Date of Patent: Oct. 7, 2014

(54) METHOD OF CUTTING LIGHT EMITTING ELEMENT PACKAGES EMPLOYING CERAMIC SUBSTRATE, AND METHOD OF CUTTING MULTILAYERED OBJECT

(75) Inventors: Eui-seok Kim, Seoul (KR); Won-soo Ji, Gyeonggi-do (KR); Choo-ho Kim, Gyeonggi-do (KR); Shin-min Rhee, Seoul (KR); Dong-hun Lee, Chungcheongnam-do (KR); Hee-young Jun, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 24 days.

(21) Appl. No.: 13/408,433

(22) Filed: Feb. 29, 2012

(65) Prior Publication Data

US 2013/0095586 A1   Apr. 18, 2013

(30) Foreign Application Priority Data

Oct. 13, 2011   (KR) .................. 10-2011-0104829

(51) Int. Cl.
| | |
|---|---|
| *H01L 33/48* | (2010.01) |
| *H01L 21/00* | (2006.01) |
| *H01L 33/00* | (2010.01) |
| *B23K 26/40* | (2014.01) |
| *B23K 26/00* | (2014.01) |

(52) U.S. Cl.
CPC .......... *B23K 26/409* (2013.01); *H01L 33/0095* (2013.01); *B23K 26/408* (2013.01); *B23K 2201/36* (2013.01); *B23K 26/0093* (2013.01); *H01L 2933/0033* (2013.01)
USPC .................. 438/25; 438/26; 438/33; 438/106

(58) Field of Classification Search
None
See application file for complete search history.

(56) References Cited

U.S. PATENT DOCUMENTS

| | | | | |
|---|---|---|---|---|
| 5,219,796 | A * | 6/1993 | Quinn et al. ..................... | 438/68 |
| 7,494,900 | B2 * | 2/2009 | Harris et al. .................... | 438/460 |
| 2004/0051118 | A1 * | 3/2004 | Bruhns et al. ................. | 257/200 |
| 2010/0295079 | A1 * | 11/2010 | Melman ......................... | 257/98 |

FOREIGN PATENT DOCUMENTS

| | | |
|---|---|---|
| JP | 2001-217372 | 8/2001 |
| JP | 2011-009681 | 1/2011 |
| KR | 10-0646569 B1 | 11/2006 |
| KR | 10-0815226 B1 | 3/2008 |
| KR | 10-2008-0096997 A | 11/2008 |
| KR | 10-2010-0042081 A | 4/2010 |

\* cited by examiner

*Primary Examiner* — Zandra Smith
*Assistant Examiner* — Pamela E Perkins
(74) *Attorney, Agent, or Firm* — McDermott Will & Emery LLP

(57) ABSTRACT

A method of cutting light emitting element packages includes preparing a ceramic substrate having a surface on which a plurality of light emitting element chips are mounted and a light-transmitting material layer is formed to cover the plurality of light emitting element chips; partially removing the light-transmitting material layer between the plurality of light emitting element chips along a cutting line by using a mechanical cutting method; and separating individual light emitting element packages by cutting the ceramic substrate along the cutting line by using a laser cutting method.

7 Claims, 6 Drawing Sheets

METHOD OF CUTTING LIGHT EMITTING ELEMENT PACKAGES EMPLOYING CERAMIC SUBSTRATE, AND METHOD OF CUTTING MULTILAYERED OBJECT

CROSS-REFERENCE TO RELATED APPLICATIONS

This application claims the benefit of Korean Patent Application No. 10-2011-0104829, filed on Oct. 13, 2011, in the Korean Intellectual Property Office, the disclosure of which is incorporated herein in its entirety by reference.

BACKGROUND

1. Field

The present disclosure relates to methods of cutting light emitting element packages employing a ceramic substrate, and methods of cutting a multilayered object.

2. Description of the Related Art

Light emitting element chips such as light emitting diodes (LEDs) are semiconductor elements for emitting light of various colors by forming a light emitting source by using PN junctions of compound semiconductors. LEDs may have a long life, a small size, a low weight, and a strong directivity of light, and may operate at a low voltage. Also, LEDs may be robust against impact and vibration, may not require a warm-up time or a complicated operation, may be packaged in various forms, and thus may have a variety of uses.

A light emitting element chip such as an LED is packaged on a metallic lead frame and a mold frame, and thus is manufactured as a light emitting element package.

Since high-power LED products have been developed, a package capable of effectively radiating heat generated during operation is required. Packages using a ceramic substrate on which metal patterns are formed have excellent heat radiation properties in comparison to packages using a lead frame and a mold frame, and thus are used to package high-power LEDs. After the packaging process, a cutting process for individually separating a plurality of LED packages is required. The cutting process is performed by using a blade sawing method, i.e., a cutting method using a rotating blade wheel. However, since the ceramic substrate is not easy to cut and thus productivity of the cutting process is reduced, a large number of blade sawing devices have to be used to increase a yield rate.

SUMMARY

Provided are methods of cutting light emitting element packages employing a ceramic substrate to increase productivity of a cutting process, and methods of cutting a multilayered object.

Additional aspects will be set forth in part in the description which follows and, in part, will be apparent from the description, or may be learned by practice of the presented embodiments.

According to an aspect of the present invention, a method of cutting light emitting element packages includes preparing a ceramic substrate having a surface on which a plurality of light emitting element chips are mounted and a light-transmitting material layer is formed to cover the plurality of light emitting element chips; partially removing the light-transmitting material layer between the plurality of light emitting element chips along a cutting line by using a mechanical cutting method; and separating individual light emitting element packages by cutting the ceramic substrate along the cutting line by using a laser cutting method.

The mechanical cutting method may include one of a blade sawing method, a water-jet method, and an aerosol-jet method.

The laser cutting method may be a full-cutting method for cutting the ceramic substrate by irradiating a high-power laser beam onto the ceramic substrate. The high-power laser beam may be irradiated onto the ceramic substrate through a groove formed by partially removing the light-transmitting material layer. The high-power laser beam may be irradiated onto an opposite surface of the ceramic substrate which is opposite to the surface of the ceramic substrate.

The separating of the individual light emitting element packages may include forming a scribing line on the ceramic substrate by irradiating a laser beam onto the ceramic substrate along the cutting line; and separating the individual light emitting element packages by cutting the ceramic substrate along the scribing line by applying a mechanical impact to the ceramic substrate.

The scribing line may be formed on the surface of the ceramic substrate, or an opposite surface of the ceramic substrate which is opposite to the surface of the ceramic substrate.

The light-transmitting material layer may include a light-transmitting silicon layer.

According to another aspect of the present invention, a method of cutting a multilayered object includes preparing an object including a first material layer, and a second material layer stacked on the first material layer and formed of a material different from the material for forming the first material layer; partially removing the second material layer along a cutting line by using a mechanical cutting method; and cutting the first material layer along the cutting line by using a laser cutting method.

The laser cutting method may be a full-cutting method for cutting the first material layer by irradiating a high-power laser beam onto the first material layer.

The cutting of the first material layer may include forming a scribing line on the first material layer by irradiating a laser beam onto the first material layer along the cutting line; and cutting the first material layer along the scribing line by applying a mechanical impact to the first material layer.

The first material layer may be a ceramic substrate on which circuit patterns are formed, and has a surface on which light emitting element chips are mounted, and the second material layer may be a light-transmitting material layer formed to cover the light emitting element chips.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
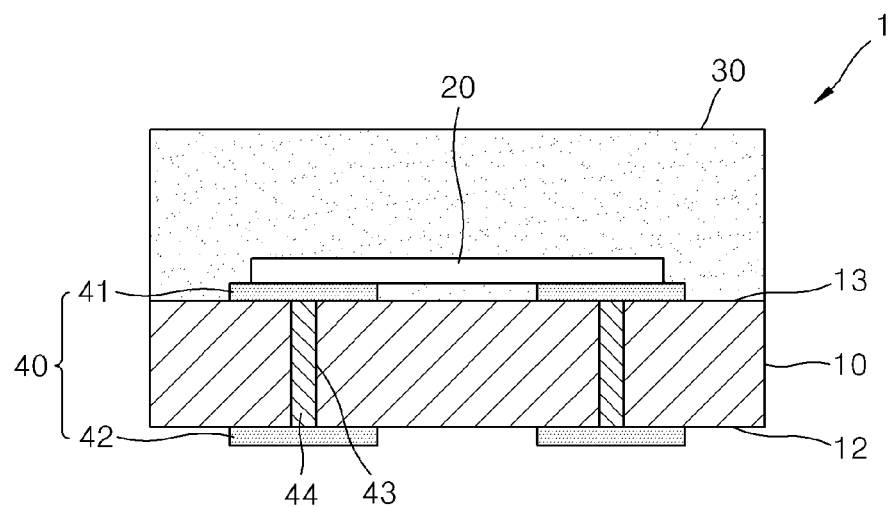
FIG. 1 is a cross-sectional view of a light emitting element package manufactured by using a cutting method, according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of a light emitting element package 1 manufactured by using a cutting method, according to an embodiment of the present invention. Referring to FIG. 1, the light emitting element package 1 may include a ceramic substrate 10, a light emitting element chip 20 mounted on the ceramic substrate 10, and a light-transmitting material layer 30 covering the light emitting element chip 20.

The light emitting element chip 20 may be, for example, a light emitting diode (LED) chip. The LED chip may emit blue, green, or red light according to a material of a compound semiconductor for forming the LED chip. For example, a blue LED chip may include an active layer having a structure of a plurality of quantum well layers formed by alternating GaN and InGaN, and P-type and N-type clad layers formed of a compound semiconductor of $Al_xGa_yN_z$ may be formed on and under the active layer. Also, the LED chip may emit ultraviolet (UV) light having no color. Although the light emitting element chip 20 is an LED chip in the above description, the current embodiment is not limited thereto. For example, the light emitting element chip 20 may also be a UV photodiode chip, a laser diode chip, or an organic LED (OLED) chip.

The ceramic substrate 10 is formed of, for example, alumina ($Al_2O_3$) or AlN having excellent heat radiation and electrical insulation properties, and circuit patterns 40 are formed on the ceramic substrate 10. The circuit patterns 40 may include, for example, first and second circuit patterns 41 and 42 respectively formed on a surface 13 and an opposite surface 12 of the ceramic substrate 10. The first and second circuit patterns 41 and 42 may be connected to each other through via holes 43 that penetrate through the ceramic substrate 10. For example, since a conductive material 44 is filled in the via holes 43, the first and second circuit patterns 41 and 42 may be connected to each other. The first and second circuit patterns 41 and 42 may be formed by forming conductive material layers on the surface 13 and the opposite surface 12 of the ceramic substrate 10 by using a printing method, a plating method, or the like. The first circuit pattern 41 may include two patterns separately corresponding to an anode (not shown) and a cathode (not shown) of the light emitting element chip 20.

The light-transmitting material layer 30 covers and protects the light emitting element chip 20. In addition, the light-transmitting material layer 30 may adjust the directivity or the color of light emitted from the light emitting element chip 20. The light-transmitting material layer 30 may be formed of a light-transmitting material for transmitting light emitted from the light emitting element chip 20, e.g., light-transmitting silicon. Although the light-transmitting material layer 30 is flat in FIG. 1, the present invention is not limited thereto. The light-transmitting material layer 30 may also have various shapes.

Figure 2:
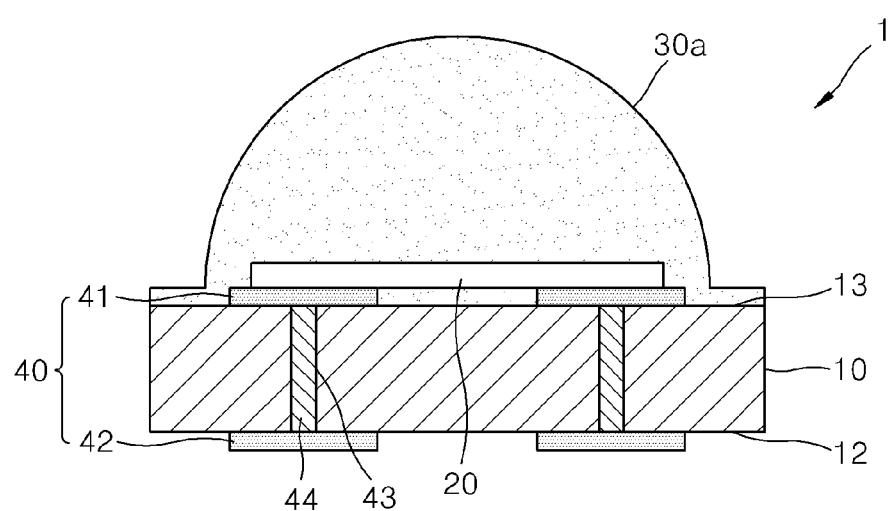
FIG. 2 is a cross-sectional view of a light emitting element package manufactured by using a cutting method, according to another embodiment of the present invention.

In order to adjust the directivity of light, as illustrated in FIG. 2, a light-transmitting material layer 30a may have a shape of a lens. The light-transmitting material layer 30a may have various shapes such as a concave lens and a convex lens according to an application field of the light emitting element package 1.

In order to adjust the color of light, the light-transmitting material layer 30 or 30a may include a phosphor. The phosphor may be appropriately selected according to a desired color. The phosphor may be dispersed in a light-transmitting material for forming the light-transmitting material layer 30 or 30a.

Although a light-transmitting material layer is a monolayer in the above description, the present invention is not limited thereto. For example, the light-transmitting material layer may be a double layer including a phosphor layer including a phosphor for adjusting the color of light emitted from the light emitting element chip 20, and a protective layer covering the phosphor layer and the light emitting element chip 20. Also, the protective layer may have a shape of a lens. Alternatively, the light-transmitting material layer may have a multilayer structure including three or more layers according to an application field of the light emitting element package 1.

Figure 3:
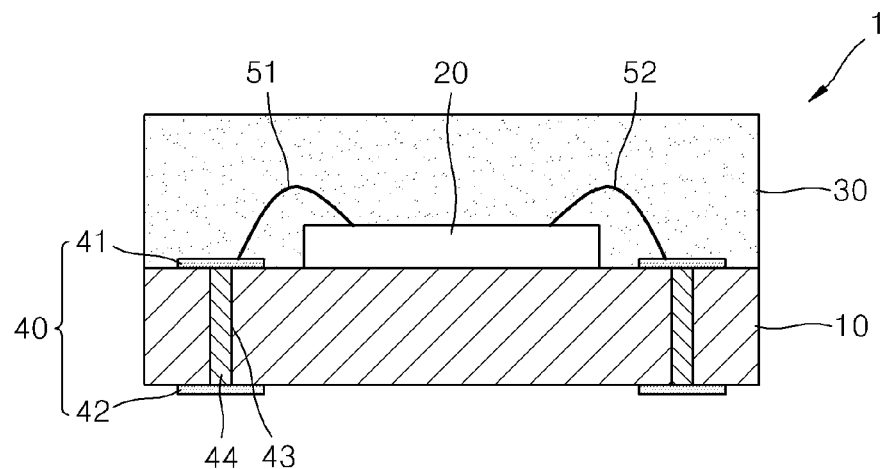
FIG. 3 is a cross-sectional view of a light emitting element package manufactured by using a cutting method, according to another embodiment of the present invention.

Although the anode and cathode of the light emitting element chip 20 are directly electrically connected to the first circuit pattern 41 formed on the surface 13 of the ceramic substrate 10 in FIG. 1, the present invention is not limited thereto. As illustrated in FIG. 3, the light emitting element chip 20 may be directly mounted on the surface 13 of the ceramic substrate 10, and the anode and cathode may be connected to the first circuit pattern 41 via conductive wires 51 and 52. Also, although not shown in any drawing, one of the anode and cathode may be directly electrically connected to the first circuit pattern 41, and the other of the anode and cathode may be connected to the first circuit pattern 41 via a conductive wire.

Figure 4:
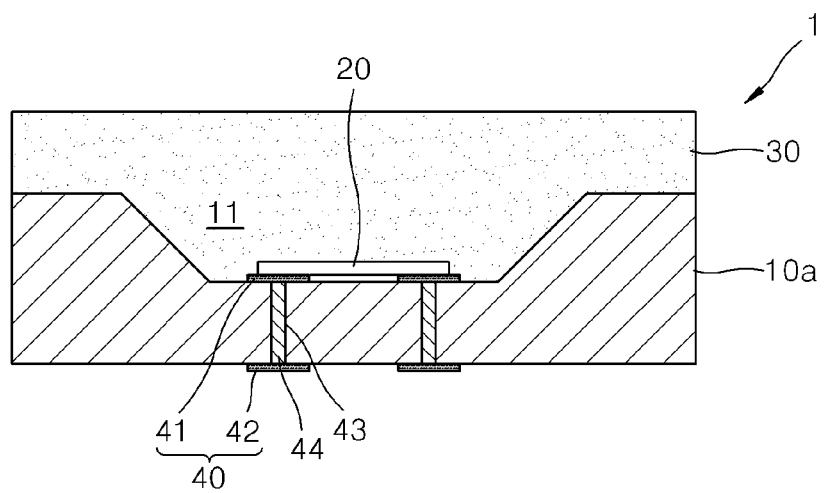
FIG. 4 is a cross-sectional view of a light emitting element package manufactured by using a cutting method, according to another embodiment of the present invention.

Also, as illustrated in FIG. 4, a ceramic substrate 10a including a recessed cavity 11 may also be employed. The light emitting element chip 20 is mounted on a bottom of the cavity 11. A side surface of the cavity 11 may be inclined upward such that light emitted from the light emitting element chip 20 may proceed externally and thus the efficiency of light may be increased. The side surface of the cavity 11 may be a reflective surface.

According to the above-described light emitting element package 1, the ceramic substrate 10 having good heat radiation properties may increase a heat radiation area and thus heat generated during operation of the high-power light emitting element package 1 may be effectively radiated.

Figure 5:
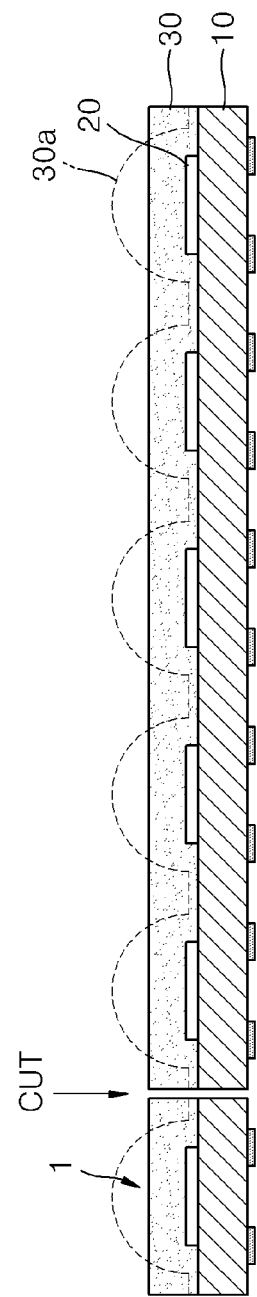
FIG. 5 is a cross-sectional view showing that a plurality of light emitting element chips are mounted and then a light-transmitting protective layer is formed on a ceramic substrate.

As illustrated in FIG. 5, the light emitting element package 1 is manufactured by mounting a plurality of light emitting element chips 20 on the ceramic substrate 10, forming the light-transmitting material layer 30 on the light emitting element chips 20 and the ceramic substrate 10, and then cutting the light-transmitting material layer 30 and the ceramic substrate 10 between the light emitting element chips 20. Generally, the cutting process is performed by using a mechanical cutting method using a blade wheel. However, the above method requires a long cutting time and has a very low production speed because the ceramic substrate 10 is particularly difficult to cut. Also, exchanging the blade wheel when required because the blade wheel becomes worn is costly, and a yield rate of the light emitting element package 1 may be reduced due to broken pieces generated during the cutting process.

A laser cutting method may be considered instead of the mechanical cutting method. A cutting process using a laser beam may obtain a very high cutting speed but may cut only a single material. That is, since a laser beam needs to have a wavelength band having absorptiveness into an object to be cut, if the object includes a plurality of different material layers, the object may not be cut or a cutting speed may be reduced. Also, if the wavelength band of the laser beam has to be changed according to the material layers, a cutting device may have a complicated structure and a cutting speed may be reduced.

Since the light emitting element package 1 using the ceramic substrate 10 is obtained by cutting the light-transmitting material layer 30 and the ceramic substrate 10, if the laser beam is set to a condition for cutting the ceramic substrate 10, the light-transmitting material layer 30 may burn or melt and thus its shape or physical properties may be changed. The above problem also occurs when the light-transmitting material layer 30 has a shape of a lens as indicated by a dashed line in FIG. 5.

In order to solve the above problem and to obtain a high cutting speed, a method of cutting the light emitting element package 1, according to an embodiment of the present invention, includes cutting the light-transmitting material layer 30 by using a mechanical cutting method before a laser cutting process is performed, so as to expose the ceramic substrate 10, and then cutting the ceramic substrate 10 by using a laser beam.

Figure 6:
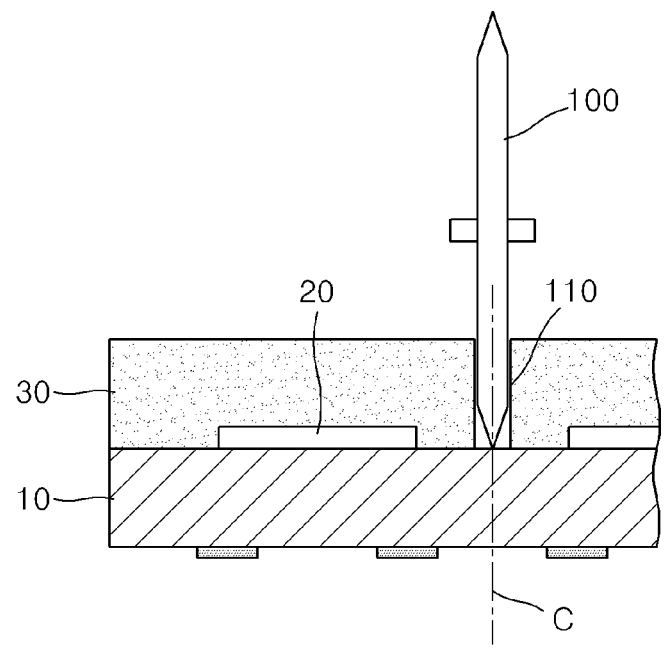
FIG. 6 is a cross-sectional view showing that the light-transmitting protective layer is partially removed by using a blade sawing method.

As illustrated in FIG. 6, the light-transmitting material layer 30 is cut first along a cutting line C between the light emitting element chips 20 by using a mechanical cutting device, e.g., a blade wheel 100. As such, the light-transmitting material layer 30 is partially removed to form a groove 110 along the cutting line C. The groove 110 may have a sufficient depth to expose the ceramic substrate 10, and may slightly intrude into the ceramic substrate 10.

The mechanical cutting device is not limited to the blade wheel 100, and may also be any mechanical cutting device for cutting the light-transmitting material layer 30, for example, a water-jet cutting device or an aerosol-jet cutting device. Since the light-transmitting material layer 30 is formed of a light-transmitting resin material, the light-transmitting material layer 30 may be easily cut and thus a high cutting speed may be obtained even by using a mechanical cutting process.

Figure 7:
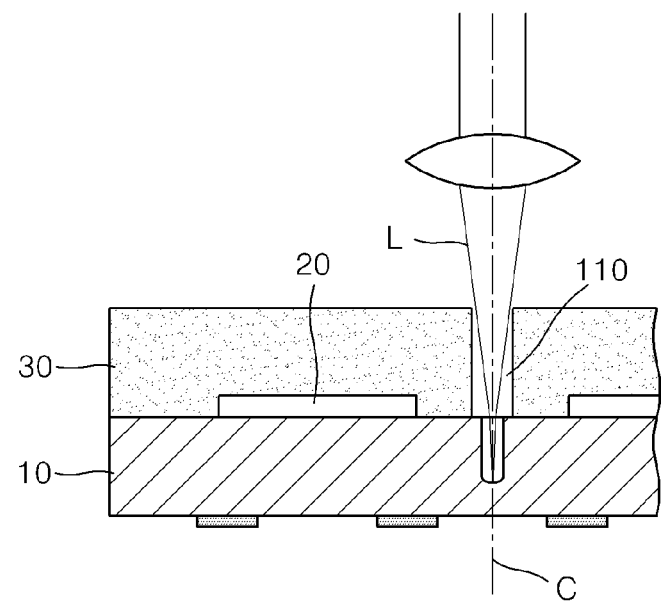
FIG. 7 is a cross-sectional view showing that the ceramic substrate is cut by irradiating a laser beam onto the ceramic substrate through a groove by using a laser full-cutting method.

Then, as illustrated in FIG. 7, the ceramic substrate 10 may be cut by irradiating a high-power laser beam L onto the ceramic substrate 10 through the groove 110. The laser beam L is adjusted to a wavelength band for allowing energy of the laser beam L to be absorbed into the ceramic substrate 10. This laser cutting process may be performed by using a so-called full-cutting method for melting and vaporizing the ceramic substrate 10 by using the high-power laser beam L.

For example, if the ceramic substrate 10 has a thickness of 0.5 mm and the light-transmitting material layer 30 is formed of silicon having a thickness of about 0.1 mm, the light-transmitting material layer 30 may be cut at a speed of about 200 mm/s by using a blade sawing method or a water-jet method, and the ceramic substrate 10 may be cut at a speed of about 60 mm/s by using a laser full-cutting method. Accordingly, since the speed of cutting the light-transmitting material layer 30 by using a mechanical cutting process does not influence the speed of cutting the ceramic substrate 10 by using a laser full-cutting method, an overall cutting speed as well as a laser full-cutting speed may be increased. Considering that the speed of cutting the whole light emitting element package 1 by using a blade sawing method is about 10 mm/s, the speed of a cutting method according to an embodiment of the present invention may be almost six times greater than the speed of a general cutting method. Also, in consideration of the same cutting speed, costs for cutting equipment may be reduced.

Figure 8:
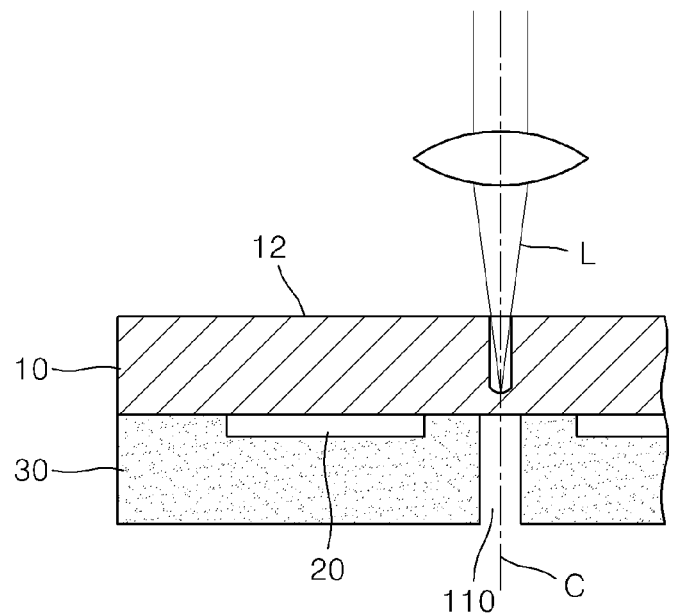
FIG. 8 is a cross-sectional view showing that the ceramic substrate is cut by irradiating a laser beam onto the ceramic substrate from a side opposite to the groove by using a laser full-cutting method.

After the groove 110 is formed, as illustrated in FIG. 8, the ceramic substrate 10 may be flipped and may be cut by irradiating the laser beam L onto the opposite surface 12 of the ceramic substrate 10 where the light-transmitting material layer 30 is not formed. The above-described process may reduce the influence of heat of the laser beam L onto the light-transmitting material layer 30 in the laser full-cutting process and thus may reduce damage or deformation of the light-transmitting material layer 30.

Figure 9:
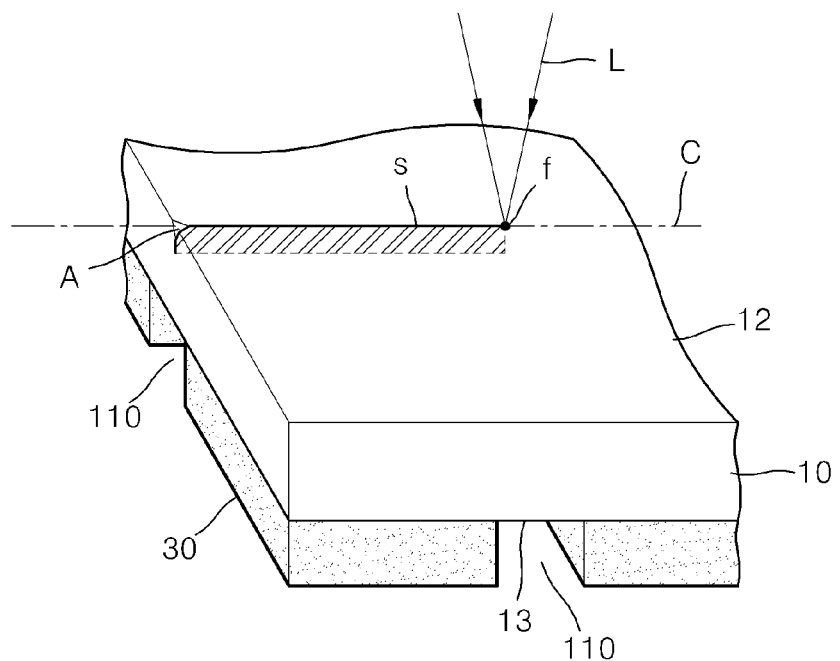
FIG. 9 is a perspective view showing that a scribing line is formed on the ceramic substrate by using a laser scribing method.
Figure 10:
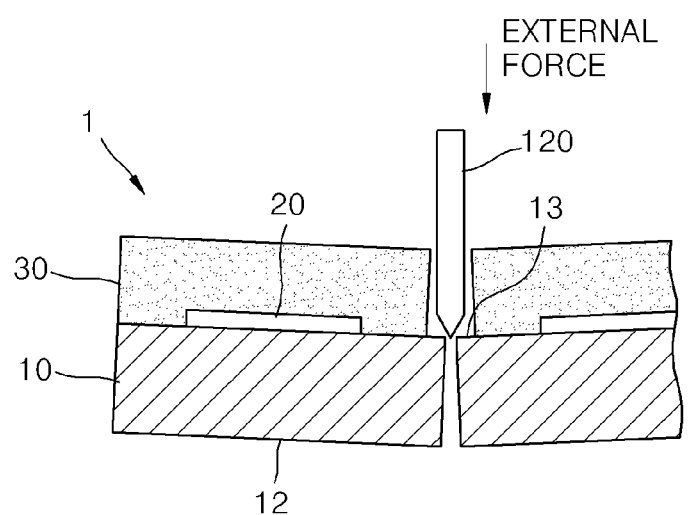
FIG. 10 is a perspective view showing that the ceramic substrate is cut by using a breaking blade along the scribing line.

In order to cut the ceramic substrate 10 after the groove 110 is formed, a laser scribing and breaking process illustrated in FIGS. 9 and 10 may also be performed. The laser scribing process refers to a process of forming a scribing line S on the ceramic substrate 10 by irradiating the laser beam L having a wavelength band having absorptiveness into the ceramic substrate 10, i.e., having a non-transmissive wavelength band, onto a light-incident surface of the ceramic substrate 10, e.g., the surface 13 or the opposite surface 12. The breaking process refers to a process of dividing the ceramic substrate 10 along the scribing line S by applying a physical impact to the ceramic substrate 10.

After the groove 110 is formed as illustrated in FIG. 6, the ceramic substrate 10 is flipped and the laser beam L is irradiated onto the opposite surface 12 as a light-incident surface of the ceramic substrate 10. The focus of the laser beam L is formed on the opposite surface 12. The laser beam L may form one or more beam spots F on the opposite surface 12. If a plurality of beam spots F are formed, the beam spots F may be aligned in a line along a process direction, i.e., a direction of relative movement of the laser beam L and the ceramic substrate 10. Also, the beam spots F may be spaced apart from each other, or may partially overlap each other. The beam spots F may have a shape of a circle or an oval having a major axis along the process direction.

The laser beam L is irradiated onto the opposite surface 12 of the ceramic substrate 10 along the cutting line C. The energy of the laser beam L may be set only to locally heat and not to melt or vaporize the ceramic substrate 10. Portions of the opposite surface 12 of the ceramic substrate 10 locally heated by the laser beam L, i.e., portions where the beam spots F pass, tend to expand due to a temperature increase. However, regions around the beam spots F are not heated and thus disturb the expansion. Accordingly, compressive stress locally occurs in a radius direction of the portions where the beam spots F pass, and tensile stress occurs in a direction orthogonal to the radius direction. The energy of the laser beam L is controlled to prevent the tensile stress not to be greater than a breaking threshold of the ceramic substrate 10.

If the ceramic substrate 10 is cooled after the beam spots F pass, contraction occurs. In this case, the tensile stress is amplified and thus a crack is generated in the opposite surface 12 of the ceramic substrate 10. The crack extends from the opposite surface 12 of the ceramic substrate 10 to a predetermined thickness that is less than a total thickness of the ceramic substrate 10. As such, the scribing line S may be formed by irradiating the laser beam L onto the opposite surface 12 of the ceramic substrate 10 along the cutting line C, as illustrated in FIG. 9.

Although the opposite surface 12 of the ceramic substrate 10 is naturally cooled after the beam spots F pass in the above description, in some cases, a cooling fluid may be sprayed onto the opposite surface 12 of the ceramic substrate 10 where the beam spots F pass. Also, before the laser beam L is irradiated, a notch-shaped groove A indicating a start point of the scribing line S may be formed in the opposite surface 12 of the ceramic substrate 10.

Although the laser beam L is irradiated onto the opposite surface 12 of the ceramic substrate 10 as a light-incident surface in the above process, the surface 13 of the ceramic substrate 10 may also be used as the light-incident surface. In this case, the laser beam L is irradiated onto the surface 13 of the ceramic substrate 10 through the groove 110. However, if the opposite surface 12 is used as the light-incident surface, the influence of heat onto the light-transmitting material layer 30 and the light emitting element chip 20 may be reduced.

The ceramic substrate 10 is not divided along the scribing line S even after the scribing line S is formed. Accordingly, a breaking process for breaking the ceramic substrate 10 along the scribing line S is performed. Referring to FIG. 10, if the surface 13 of the ceramic substrate 10 opposite to the opposite surface 12 on which the scribing line S is formed is pressed by using a breaking blade 120, the crack for forming the scribing line S extends in a thickness direction of the ceramic substrate 10 and thus the ceramic substrate 10 is divided along the scribing line S. Alternatively, the breaking blade 120 may press the opposite surface 12 of the ceramic substrate 10.

Even when the scribing line S is formed on the surface 13 of the ceramic substrate 10, the opposite surface 12 or the surface 13 of the ceramic substrate 10 may be pressed by using the breaking blade 120 and the crack may extend along a thickness direction of the ceramic substrate 10, thereby dividing the ceramic substrate 10 along the scribing line S.

The light emitting element package 1 may be completely manufactured by performing the above-described laser scribing and breaking process. According to test results, a cutting speed when the whole light emitting element package 1 is cut by using a blade sawing method is about 320 sec/Frame while the speed of a process of forming the groove 110 by using a blade sawing method is about 35 sec/Frame, the speed of a laser scribing process is about 35 sec/Frame, and the speed of a breaking process is about 53 sec/Frame. Accordingly, a cutting speed when the processes are simultaneously performed depends on a time taken to perform the breaking process and, in this case, a six-fold increase in productivity may be expected in comparison to a case when the whole light emitting element package 1 is cut by using a blade sawing method. Also, in consideration of the same cutting speed, costs for cutting equipment may be reduced.

Although the light emitting element package 1 including the ceramic substrate 10 and the light-transmitting material layer 30 is cut in the above description, the present invention is not limited thereto. For example, the present invention may also be applied to a process of cutting a multilayered object including a first material layer that may be cut using a laser beam, and a second material layer that is stacked on the first material layer, is formed of a material different from the material for forming the first material layer, and is meltable, burnable, or deformable by the laser beam for cutting the first material layer. In more detail, the second material layer may be cut along a cutting line by using a mechanical cutting method, e.g., a blade sawing method, a water-jet method, or a aerosol-jet method, so as to expose the first material layer, and then the first material layer may be cut by using a laser cutting method, e.g., a laser full-cutting method or a laser scribing and breaking method. In this case, as described above, a light-incident surface may be a surface of the first material layer on which the second material layer is formed, or an opposite surface of the first material layer.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of cutting light emitting element packages each including a light emitting element chip, the method comprising steps of:
    preparing a ceramic substrate having a surface on which a plurality of light emitting element chips are mounted, wherein a light-transmitting material layer is formed to cover the plurality of light emitting element chips;
    partially removing the light-transmitting material layer between the plurality of light emitting element chips along a cutting line and forming a groove, through which an uppermost portion of the ceramic substrate is exposed, along the cutting line by a mechanical cutting method; and
    the step of partially removing the light-transmitting material layer between the plurality of light emitting element chips along the cutting line, irradiating a laser beam onto the ceramic substrate along the cutting line to form a scribing line on a surface of the ceramic substrate opposite to the surface on which the plurality of light emitting element chips are disposed;
    after forming the scribing line, separating individual light emitting element packages by cutting the ceramic substrate along the scribing line by applying a mechanical impact to the uppermost portion of the ceramic substrate exposed through the groove.

2. The method of claim 1, wherein the mechanical cutting method comprises one of a blade sawing method, a water-jet method, and an aerosol-jet method.

3. The method of claim 1, wherein the laser cutting method is a full-cutting method for cutting the ceramic substrate by irradiating a high-power laser beam onto the ceramic substrate.

4. The method of claim 3, wherein the high-power laser beam is irradiated onto an opposite surface of the ceramic substrate which is opposite to the surface of the ceramic substrate.

5. The method of claim 1, wherein the light-transmitting material layer comprises a light-transmitting silicon layer.

6. A method of cutting a multilayered object including a plurality of light emitting element chips, the method comprising steps of:
    preparing an object including a first material layer and a second material layer stacked on a first surface of the first material layer, the second material layer being of a material different from a material of the first material layer;

partially removing the second material layer along a cutting line and forming a groove, through which an uppermost portion of the first material is exposed, along the cutting line by using a mechanical cutting method;

after the step of partially removing the second material layer along the cutting line, irradiating a laser beam onto the first material layer along the cutting line to form a scribing line on a second surface of the first material layer opposite to the first surface of the first material layer; and after forming the scribing line, cutting the first material layer along the cutting line along the scribing line by applying a mechanical impact to the uppermost portion of the first material layer exposed through the groove.

7. The method of claim 6, wherein the first material layer is a ceramic substrate on which circuit patterns are formed, and has a surface on which light emitting element chips are mounted, and wherein the second material layer is a light-transmitting material layer formed to cover the light emitting element chips.

\* \* \* \* \*